(12) United States Patent
Wang et al.

(10) Patent No.: US 12,254,951 B2
(45) Date of Patent: Mar. 18, 2025

(54) MEMORY DEVICE INCLUDING PAGE BUFFER, MEMORY SYSTEM INCLUDING PAGE BUFFER, AND OPERATING METHOD THEREOF

(71) Applicant: Yangtze Memory Technologies Co., Ltd., Hubei (CN)

(72) Inventors: Yan Wang, Hubei (CN); Xiaojiang Guo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 100 days.

(21) Appl. No.: 18/173,567

(22) Filed: Feb. 23, 2023

(65) Prior Publication Data
US 2024/0242745 A1   Jul. 18, 2024

(30) Foreign Application Priority Data
Jan. 18, 2023   (CN) .......................... 202310090100.7

(51) Int. Cl.
*G11C 7/10*   (2006.01)
*G11C 7/12*   (2006.01)
(52) U.S. Cl.
CPC ............ *G11C 7/1039* (2013.01); *G11C 7/106* (2013.01); *G11C 7/12* (2013.01)

(58) Field of Classification Search
CPC ..................................................... G11C 7/1039
USPC ..................................................... 365/189.05
See application file for complete search history.

(56) References Cited

U.S. PATENT DOCUMENTS

| | | | |
|---|---|---|---|
| 2008/0080257 A1* | 4/2008 | Park ...................... | G11C 16/26 365/185.08 |
| 2024/0062831 A1* | 2/2024 | Shi ......................... | G11C 16/10 |
| 2024/0170073 A1* | 5/2024 | Deng ..................... | G11C 7/1006 |

* cited by examiner

*Primary Examiner* — Hoai V Ho
(74) *Attorney, Agent, or Firm* — HANLEY, FLIGHT & ZIMMERMAN, LLC

(57) ABSTRACT

The present disclosure provides a memory device that includes a memory array and a page buffer. The memory array includes a plurality of memory cells coupled to a bit line of the memory array. The page buffer is coupled to the plurality of memory cells via the bit line to sense stored data in the memory cells. The page buffer includes first, second, and third transistors coupled to the bit line, first and second nodes, a capacitance structure coupled to the first node, and a latch circuit coupled to the bit line via the first transistor. First terminals of the first, second, and third transistors are coupled to the first node. A second terminal of the second transistor is coupled to the second node. The third transistor amplifies a read margin voltage at the second node. The page buffer shortens a time of a read operation or verify operation.

20 Claims, 14 Drawing Sheets

MEMORY DEVICE INCLUDING PAGE BUFFER, MEMORY SYSTEM INCLUDING PAGE BUFFER, AND OPERATING METHOD THEREOF

TECHNICAL FIELD

The present disclosure generally relates to the field of semiconductor technology, and more particularly, to a method and a storage system for a NAND memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells sharing the same word line can be read or programmed simultaneously. However, due to aggressive scaling, reliability can be a concern for a 3D NAND flash memory.

BRIEF SUMMARY

Embodiments of methods and systems for data protection in a memory device are described in the present disclosure.

In some embodiments, a page buffer can provide operation time reduction for a memory device. The memory device can include a memory array and the page buffer. The memory array can include a plurality of memory cells coupled to a bit line of the memory array. The memory cells can store data. The page buffer can be coupled to the plurality of memory cells via the bit line and can sense the stored data. The page buffer can include first, second, and third transistors coupled to the bit line, first and second nodes, a capacitance structure coupled to the first node, and a latch circuit coupled to the bit line via the first transistor. First terminals of the first, second, and third transistors can be coupled to the first node. A second terminal of the second transistor can be coupled to the second node. The third transistor can amplify a read margin voltage at the second node. The page buffer can shorten a time of execution of a read operation or verify operation for sensing the stored data based on the amplification of the read margin voltage. The latch circuit can exhibit an electronic state corresponding to the stored data based on the read operation or verify operation.

In some embodiments, the capacitance structure can include a capacitor or a length of circuit wire having a parasitic capacitance.

In some embodiments, the capacitance structure can be a first a capacitance structure. The page buffer further can include a second capacitance structure coupled to the second node.

In some embodiments, the second capacitance structure can include a capacitor or a length of circuit wire having a parasitic capacitance.

In some embodiments, a capacitance of the second capacitance structure can be less than a capacitance of the first capacitance structure.

In some embodiments, a capacitance of the first capacitance structure can be at least two times greater than a capacitance of the second capacitance structure.

In some embodiments, a second terminal of the third transistor can be coupled to the first node.

In some embodiments, a second terminal of the third transistor can be coupled to the second node.

In some embodiments, the capacitance structure can reduce a duration of the read operation or verify operation. A performance of the memory device is enhanced based on the reducing of the duration.

In some embodiments, the latch circuit can be a first latch circuit. The page buffer can also include a second latch circuit and a transistor associated with the second latch circuit. The capacitance structure can include a length of wire having a parasitic capacitance. The length of wire can be coupled to the transistor associated with the second latch circuit.

In some embodiments, a page buffer can provide operation time reduction for a memory system. The memory system can include a memory device. The memory device can include a memory array and the page buffer. The memory array can include a plurality of memory cells coupled to a bit line of the memory array. The memory cells can store data. The page buffer can be coupled to the plurality of memory cells via the bit line and can sense the stored data. The page buffer can include first, second, and third transistors coupled to the bit line, first and second nodes, a capacitance structure coupled to the first node, and a latch circuit coupled to the bit line via the first transistor. First terminals of the first, second, and third transistors can be coupled to the first node. A second terminal of the second transistor can be coupled to the second node. The third transistor can amplify a read margin voltage at the second node. The page buffer can shorten a time of execution of a read operation or verify operation for sensing the stored data based on the amplification of the read margin voltage. The latch circuit can exhibit an electronic state corresponding to the stored data based on the read operation or verify operation.

In some embodiments of the memory system, the capacitance structure can include a capacitor or a length of circuit wire having a parasitic capacitance.

In some embodiments of the memory system, the capacitance structure can be a first a capacitance structure. The page buffer further can include a second capacitance structure coupled to the second node.

In some embodiments of the memory system, the second capacitance structure can include a capacitor or a length of circuit wire having a parasitic capacitance.

In some embodiments of the memory system, a capacitance of the second capacitance structure can be less than a capacitance of the first capacitance structure.

In some embodiments of the memory system, a capacitance of the first capacitance structure can be at least two times greater than a capacitance of the second capacitance structure.

In some embodiments of the memory system, a second terminal of the third transistor can be coupled to the first node.

In some embodiments of the memory system, a second terminal of the third transistor can be coupled to the second node.

In some embodiments of the memory system, the capacitance structure can reduce a duration of the read operation or verify operation. A performance of the memory device is enhanced based on the reducing of the duration.

In some embodiments of the memory system, the latch circuit can be a first latch circuit. The page buffer can also include a second latch circuit and a transistor associated with the second latch circuit. The capacitance structure can include a length of wire having a parasitic capacitance. The length of wire can be coupled to the transistor associated with the second latch circuit.

In some embodiments, a page buffer can provide operation time reduction in the operation of a memory device. The memory device can include a memory array that includes the page buffer and a plurality of memory cells coupled to a bit line of the memory array. The page buffer can include a capacitance structure, a latch circuit, a first transistor, a second transistor, a third transistor, a first node, and a second node. First terminals of the first, second and third transistors can be coupled to the bit line. A second terminal of the second transistor can be coupled to the second node. The method can include performing a read or verify operation of stored data in the memory cells. The performing of the read or verify operation can include one or more of the following operations. The performing of the read or verify operation can include applying a bit line voltage to the bit line. The performing of the read or verify operation can also include applying a first node voltage to the first node. The performing of the read or verify operation can also include applying a second node voltage to the second node. The performing of the read or verify operation can also include applying a third transistor voltage to the third transistor. The performing of the read or verify operation can also include amplifying a read margin voltage based on the applying of the third transistor voltage. The first node voltage and the second node voltage can decrease during a develop time period after the applying of the third transistor voltage. The read margin voltage can be defined at an end of the develop time period and can correspond to a voltage difference between a value of the second node voltage associated with a maximum threshold for current corresponding to an off-state of the second node at the end of the develop time period and a value of the second node voltage associated with a minimum threshold for current corresponding to an on-state of the second node at the end of the develop time period. The performing of the read or verify operation can also include sensing the stored data in the memory cells using the latch circuit before the end of the develop time period.

In some embodiments of the method, the capacitance structure can be a first capacitance structure. The page buffer can include a second capacitance structure coupled to the second node. The amplifying of the read margin voltage can be based on the second capacitance structure having a capacitance that is less than a capacitance of the first capacitance structure.

In some embodiments of the method, the capacitance structure can be a first capacitance structure. The page buffer can include a second capacitance structure coupled to the second node. The amplifying of the read margin voltage can be based on the first capacitance structure having a capacitance that is at least two time greater than a capacitance of the second capacitance structure.

In some embodiments of the method, the amplifying of the read margin voltage can be based on a second terminal of the third transistor being coupled to the first node.

In some embodiments of the method, the amplifying of the read margin voltage can be based on a second terminal of the third transistor being coupled to the second node.

In some embodiments of the method, the method can further comprise reducing a duration of the read operation or verify operation. A performance of the memory device is enhanced based on the reducing of the duration.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 11B is a continuation of FIG. 11A.

Figure 1:
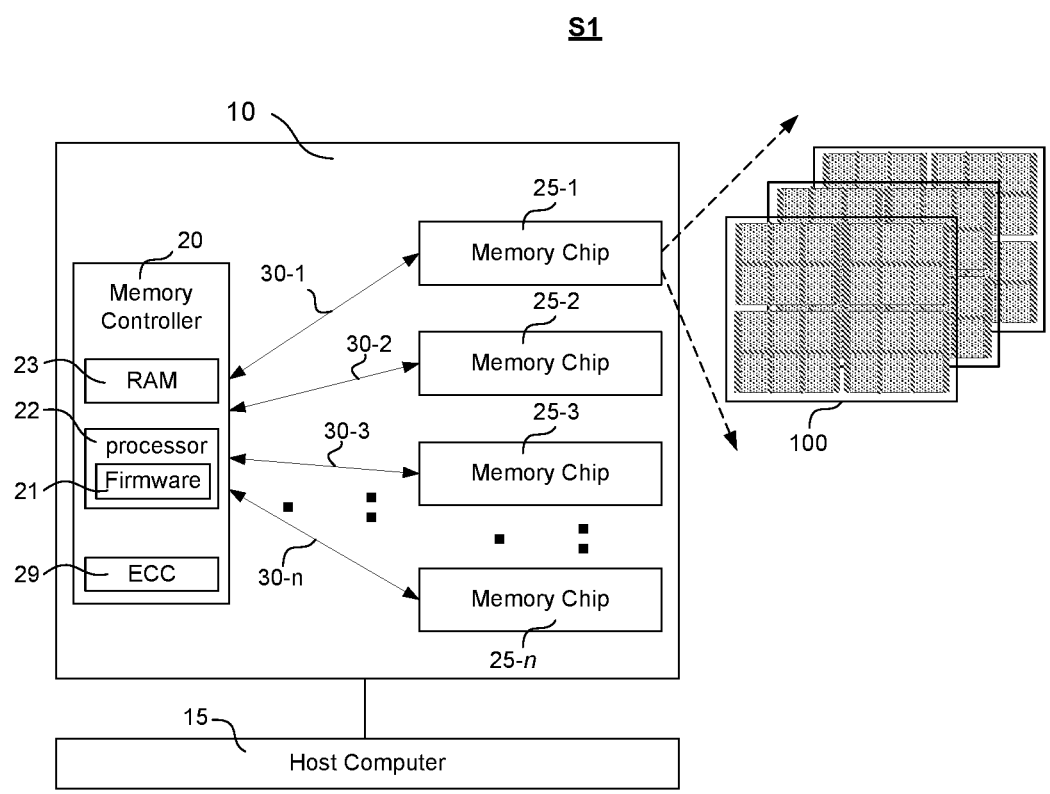
FIGS. 1 and 2A-2B illustrate a storage system with one or more memory chips, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a block diagram of a system S1 having a storage system 10, according to some embodiments. In some embodiments, system S1 can be a mobile phone, a desktop computer, a laptop computer, a tablet, a vehicle computer, a gaming console, a printer, a positioning device, a wearable electronic device, a smart sensor, a virtual reality (VR) device, an augmented reality (AR) device, or any other suitable electronic devices having storage therein. Storage system 10 (e.g., a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (e.g., "flash," "NAND flash" or "NAND"). Storage system 10 can communicate with a host 15 through memory controller 20, where memory controller 20 can be connected to one or more memory chips 25-1, 25-2, 25-3, . . . , 25-n, via one or more memory channels 30-1, 30-2, 30-3, . . . , 30-n. In some embodiments, each memory chip 25 can be managed by memory controller 20 via one or more memory channels 30-1, 30-2, 30-3, . . . , 30-n.

In some embodiments, host 15 can include a processor of an electronic device, such as a central processing unit (CPU), or a system-on-chip (SoC), such as an application processor (AP). Host 15 can send data to be stored at storage system 10 and/or can retrieve data from stored in storage system 10.

In some embodiments, memory controller 20 can handle I/O requests received from host 15, ensure data integrity and efficient storage, and manage memory chip 25. To perform these tasks, Memory controller 20 can run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory chip 25 (e.g., actual locations where the data is stored). Controller 20 also runs firmware 21 to manage defective memory blocks in the memory chip 25, where the firmware 21 can remap the logical address to a different physical address, i.e., move the data to a different physical address (e.g., logical pages can be created by remapping). Embodiments of the present disclosure can be implemented using logical pages, physical pages, or a combination of the two. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

In some embodiments, the memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 1 can include one or more memory dies 100, where each memory die can be a 3D NAND memory.

Figure 2A:
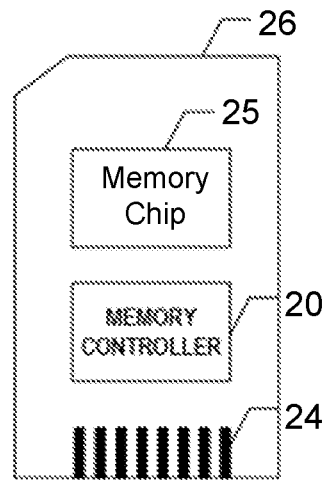
Figure 2B:
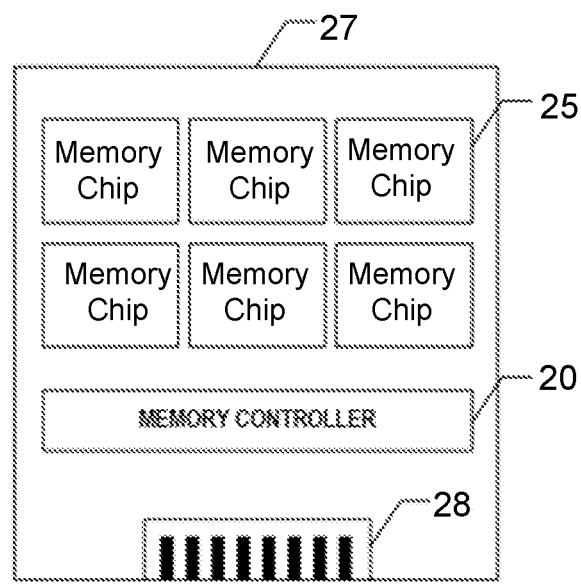

In some embodiments, memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host 15 in FIG. 1). In another example as shown in FIG. 2B, memory controller 20 and multiple memory chip 25 can be integrated into an solid state drive (SSD) 27. SSD 27 can further include an SSD connector 28 coupling SSD 27 with a host (e.g., the host 15 in FIG. 1).

Figure 3A:
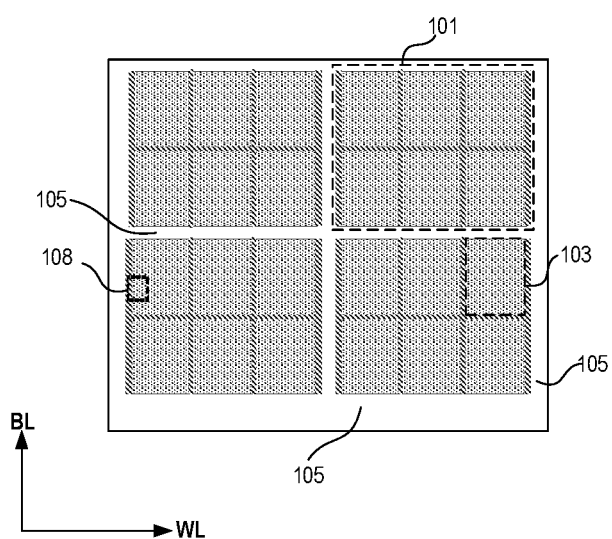
FIGS. 3A and 3B illustrate a schematic diagram of a memory die, according to some embodiments.

FIG. 3A illustrates a top-down view of a memory die 100, according to some embodiments. The example configuration shown in FIG. 3A is given as a non-limiting example and it is to be appreciated that memory is scalable. In some embodiments, memory die 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory die 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3A.

In some embodiments, memory die 100 can also include a periphery region 105, an area surrounding memory planes 101. Each plane 101 can include a memory array and a peripheral region 105. The periphery region 105 can include many digital, analog, and/or mixed-signal circuits to support functions of a memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In some embodiments, the arrangement of the memory planes 101 in the memory die 100 and the arrangement of the memory blocks 103 in each memory plane 101 illustrated in FIG. 3A are only used as an example, which does not limit the scope of the present disclosure.

Figure 3B:
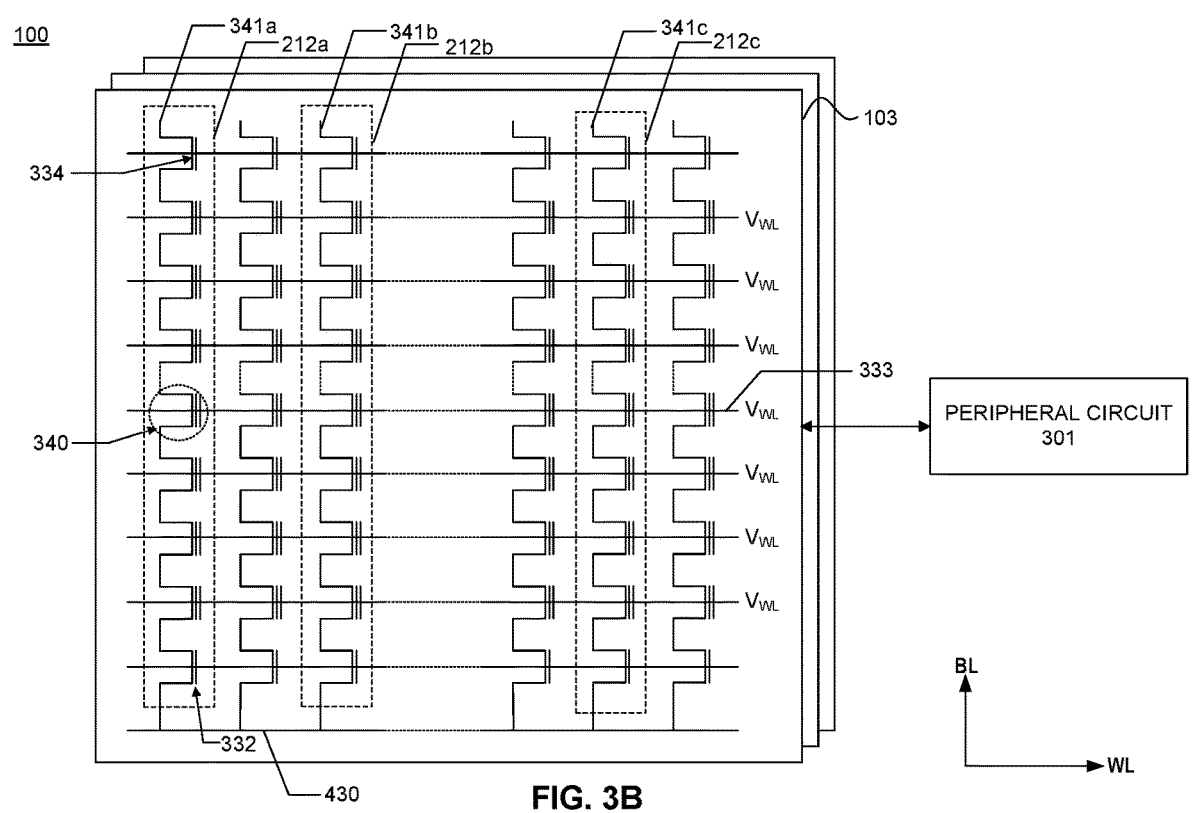

FIG. 3B illustrates an example schematic of a portion of memory die 100, according to some embodiments. Memory die 100 can include memory block 104 and a peripheral circuit 301. Peripheral circuit 301 can include a page buffer. Memory die 100 can include a plurality of memory strings, for example, memory strings 212a, 212b, and 212c. Each of memory strings 212a, 212b, and 212c can have a plurality of memory cells 340. Memory string 212a can also include at least one field effect transistor (e.g., MOSFET) at each end, which is controlled by a lower select gate (LSG) 332 and a top select gate (TSG) 334, respectively. Memory cells 340 can be controlled by a control gate, where the control gate can be connected to a word line 333 of the memory die 100. The drain terminal of TSG 334 can be connected to bit line 341a, and the source terminal of LSG 332 can be connected to an array common source (ACS) 430. The ACS 430 can be shared by the memory strings in an entire memory block, and is also referred to as the common source line. In some examples, memory string 212b can be associated with bit line 341b and memory string 212c can be associated with bit line 341c.

In some embodiments, memory die 100 can be formed based on floating gate technology. Memory die 100 can be formed based on charge trapping technology. NAND flash memory based on charge trapping can provide high storage density and high intrinsic reliability. Storage data or logic states (e.g., threshold voltage Vth of memory cells 340) depend on the amount of charge trapped in a storage layer. Memory block 103 can be a three-dimensional (3D) memory device. Memory device 100 can be a 3D memory array with memory cells 340 vertically stacked on top of each other.

In some embodiments, in a NAND memory, memory cells 340 can be in an erase state ER or a programmed state (e.g., programmed state P1, P2, P3, or the like). Initially, all memory cells 340 in can be reset to the erase state ER as logic "1" by implementing a negative voltage difference between control gates and source terminals of the memory cells (e.g., the array common source 430) such that all the trapped electronic charges in the storage layer of the memory cells 340 can be removed. For example, the negative voltage difference can be induced by setting the control gates of memory cells 340 to ground, and applying a high positive voltage to the array common source 430. At the erase state ER ("state ER"), the threshold voltage Vth of memory cells 340 can be reset to the lowest value, and can be measured or sensed at a corresponding one of bit lines 341a, 341b, or 341.

In some embodiments, during programming (i.e., writing), a programming voltage Vpgm (e.g., a positive voltage pulse between 10 V and 20 V) can be applied on the control gate such that electronic charges (e.g., electrons) can be injected into the storage layer of a given memory cell 340, and thereby increase the threshold voltage Vth of the given memory cell 340. Thus the given memory cell 340 can be programmed to a programmed state (e.g., programmed state P1, P2, P3, or the like). As an example, memory cells 340 can be programmed to different states, such as P1-P15 in QLC mode.

Figure 4:
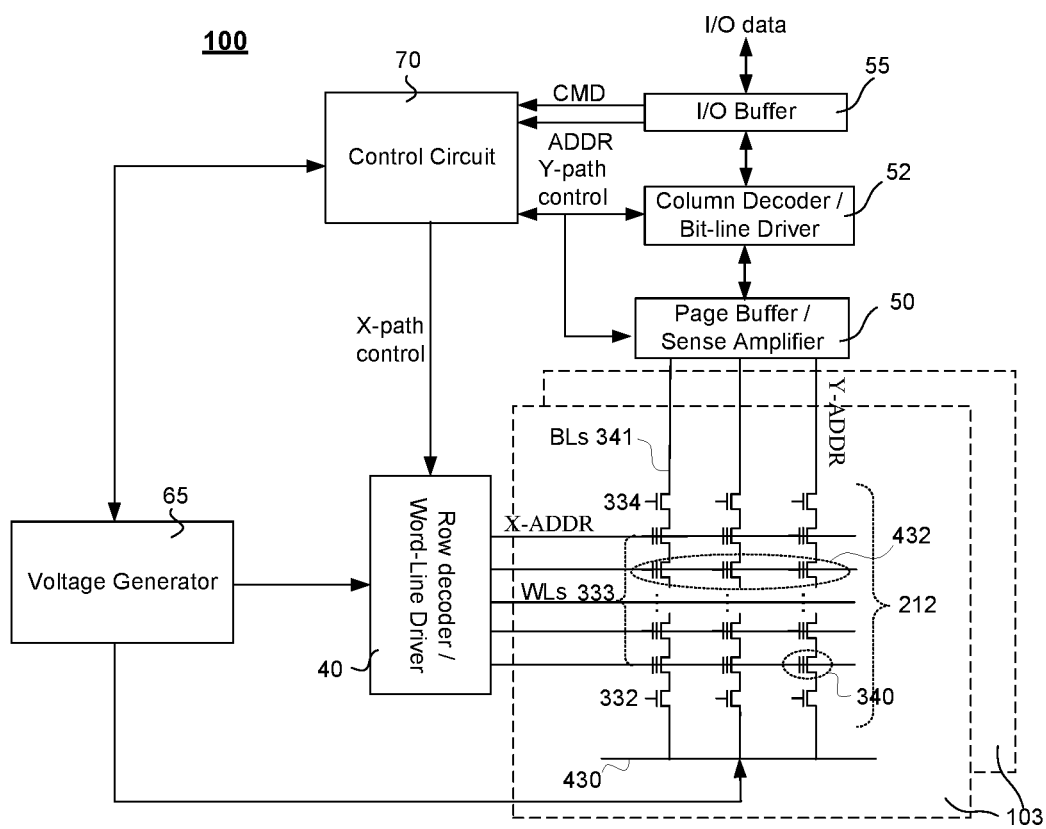
FIG. 4 illustrates a schematic of a three-dimensional (3D) memory die, according to some embodiments.

FIG. 4 illustrates a schematic diagram of the memory die 100, according to some embodiments. In some embodiments, memory die 100 can include one or more memory blocks 103 (e.g., 103-1, 103-2, 103-3). Each memory block 103 can include a plurality of memory strings 212. Each memory string 212 includes a plurality of memory cells 340. Memory string 212 can also include at least one field effect transistor (e.g., MOSFET) at each end, which is controlled by a lower select gate (LSG) 332 and a top select gate (TSG) 334, respectively. The terminal of the top select transistor 334-T can be connected to a bit line 341, and the terminal of the lower select transistor 332-T can be connected to an array common source (ACS) 430. ACS 430 can be shared by the memory strings 212 in an entire memory block, and is also referred to as the common source line.

In some embodiments, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

In some embodiments, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to a X-path control signal provided by the control circuit 70. Rrow decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the control circuit 70.

In some embodiments, column decoder/bit line driver 52 can transfer an inhibit voltage $V_{inhibit}$ to an unselected bit line and connect a selected bit line to ground according to a Y-path control signal received from control circuit 70. In the other words, column decoder/bit line driver 52 can be configured to select or unselect one or more memory strings 212 according to the Y-path control signal from control circuit 70. The page buffer/sense amplifier 50 can be configured to read and program (write) data from and to the memory block 103 according to the control signal Y-path control from the control circuit 70. For example, the page buffer/sense amplifier 50 can store one page of data to be programmed. In another example, page buffer/sense amplifier 50 can perform verify operations to ensure that the data has been properly programmed into each memory cell 340. In yet another example, during a read operation, page buffer/sense amplifier 50 can sense current flowing through the bit line 341 that reflects the logic state (i.e., data) of the memory cell 340 and amplify small signal to a measurable magnification.

In some embodiments, input/output buffer 55 can transfer the I/O data from/to the page buffer/sense amplifier 50 as well as addresses ADDR or commands CMD to the control circuit 70. In some embodiments, input/output buffer 55 can function as an interface between memory controller 20 (in FIG. 1) and memory die 100 on memory chip 25.

In some embodiments, control circuit 70 can control page buffer/sense amplifier 50 and row decoder/word line driver 40 in response to the commands CMD transferred by the input/output buffer 55. During the program operation, control circuit 70 can control row decoder/word line driver 40 and page buffer/sense amplifier 50 to program a selected memory cell. During the read operation, control circuit 70 can control row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some embodiments, voltage generator 65 can generate voltages to be supplied to word lines and bit lines under the control of control circuit 70. The voltages generated by voltage generator 65 include the read voltage $V_{read}$, the program voltage $V_{pgm}$, the pass voltage $V_{pass}$, the inhibit voltage $V_{inhibit}$, etc.

It is noted that the arrangement of the electronic components in the storage system 10 and the memory die 100 in FIGS. 1, 2A-2B, and 3-4 are shown as non-limiting examples. In some embodiments, storage system 10 and memory die 100 can have other layout and can include additional components. Components (e.g., control circuit 70, I/O buffer 55) on memory die 100 shown in FIG. 4 can also be moved off memory die 100, as a stand-alone electric component in the storage system 10. Components (e.g., control circuit 70, I/O buffer 55) on memory die 100 shown in FIG. 4 can also be moved to other components in storage system 10, for example, a portion of control circuit 70 can be combined with memory controller 20 and vice versa.

Figure 5:
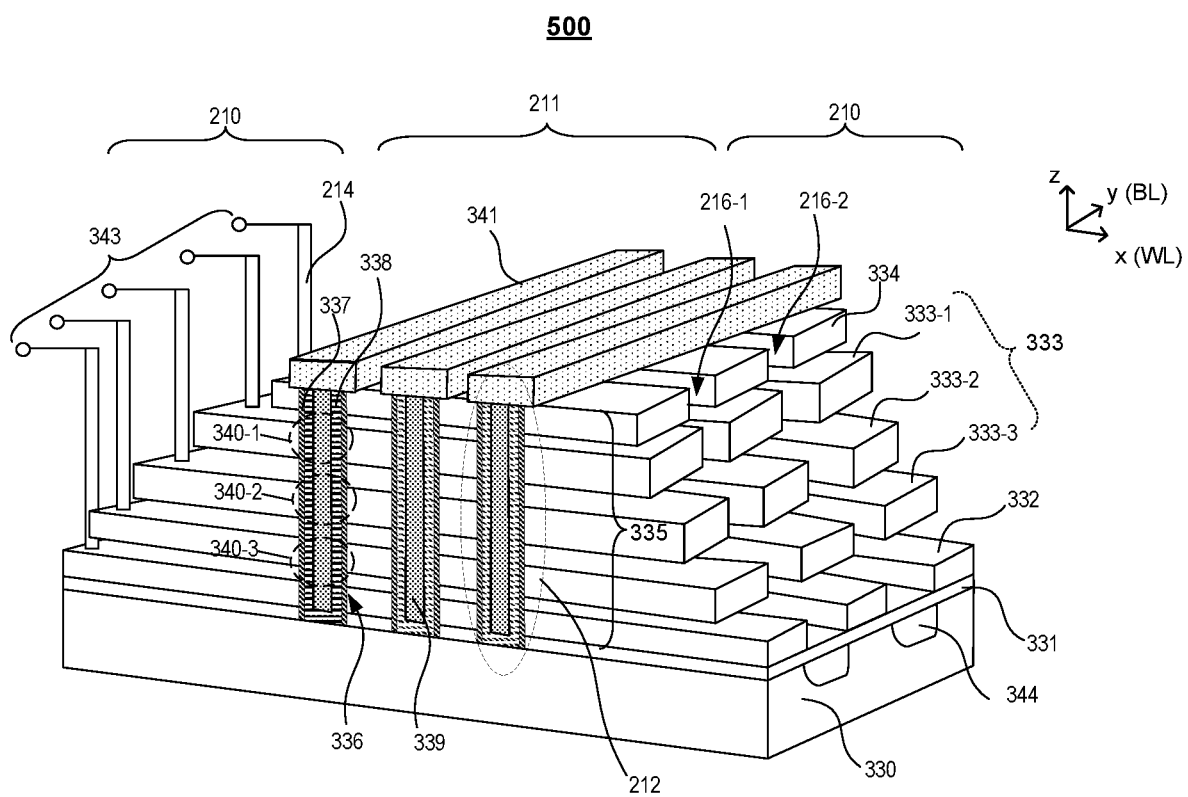
FIG. 5 illustrates a perspective view of a portion of a 3D memory structure, in accordance with some embodiments.

FIG. 5 illustrates a perspective view of a 3D memory structure 500, according to some embodiments. In some embodiments, memory die 100 can be a 3D NAND memory, and the 3D memory structure 500 can be a portion of memory die 100, for example, in a region 108 in FIG. 3. The 3D memory structure 500 can include a staircase region 210 and a channel structure region 211. Channel structure region 211 can include a plurality of memory strings 212, each including a plurality of stacked memory cells 340. Staircase region 210 can include a staircase structure.

In some embodiments, the 3D memory structure 500 can include a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

In some embodiments, the control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 can also be referred to as "gate electrodes." The 3D memory structure 500 can further include doped source line regions 344 in portions of substrate 330 between adjacent LSGs 332. Each of memory strings 212 of the 3D memory structure 500 can include a channel hole 336 extending through the insulating film 331 and the film stack 335 of alternating conductive and dielectric layers. Memory string 212 can also include a memory film 337 on a sidewall of the channel hole 336, a channel layer 338 over memory film 337, and a core filling film 339 surrounded by channel layer 338. Memory cell 340 (e.g., 340-1, 340-2, 340-3) can be formed at the intersection of the control gate 333 (e.g., 333-1, 333-2, 333-3) and memory string 212. A portion of channel layer 338 can respond to the respective control gate and is also referred to as channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted.

Referring back to FIG. 4, in some embodiments, memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages $V_{th}$ of the memory cell 340) depends on the number of charge carriers trapped in the memory film 337 of the memory cell 340.

In some embodiments, in a NAND flash memory, a read operation and a write operation (also referred to as program operation) can be performed for the memory page 432 (FIG. 4), and an erase operation can be performed for the memory block 103.

In some embodiments, in a NAND memory, the memory cell 340 can be in an erased state ER or a programmed state P1. Initially, memory cells 340 in memory block 103 can be reset to the erased state ER as logic "1" by implementing a negative voltage difference between control gates 333 and channel 338 such that trapped charge carriers in the memory film of memory cells 340 can be removed. For example, the negative voltage difference can be induced by setting control gates 333 of memory cells 340 to ground, and applying a high positive voltage (an erase voltage $V_{erase}$) to ACS 430. At the erased state ER ("state ER"), the threshold voltage $V_{th}$ of memory cells 340 can be reset to the lowest value.

In some embodiments, during programming (i.e., writing), a positive voltage difference between control gates 333 and channel 338 can be established by, for example, applying a program voltage $V_{pgm}$ (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage $V_{th}$ of memory cell 340. Accordingly, memory cell 340 can be programmed to the programmed state P1 ("state P1" or logic "0").

In some embodiments, the state of the memory cell (e.g., state ER or state P1) can be determined by measuring or sensing the threshold voltage $V_{th}$ of the memory cell. During a read operation, a read voltage $V_{read}$ can be applied on control gate 333 of the memory cell and current flowing through the memory cell can be measured at bit line 341. A pass voltage $V_{pass}$ can be applied on unselected word lines to switch on unselected memory cells.

In some embodiments, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), logic {1 and 0}, i.e., states ER and P1. In the MLC mode, a memory cell stores 2 bits, and has four logic states, logic {11, 10, 01, and 00}, i.e., states ER, P1, P2, and P3. In the TLC mode, a memory cell stores 3 bits, and has eight logic states, logic {111, 110, 101, 100, 011, 010, 001, 000}, i.e., states ER, and states P1-P7. In the QLC mode, a memory cell stores 4 bits and has 16 logic states. Memory controller 20 of storage system 10 (see FIG. 1) can convert data received from host 15 into corresponding logic states of the memory cells on memory dies 100 and vice versa.

Figure 6:
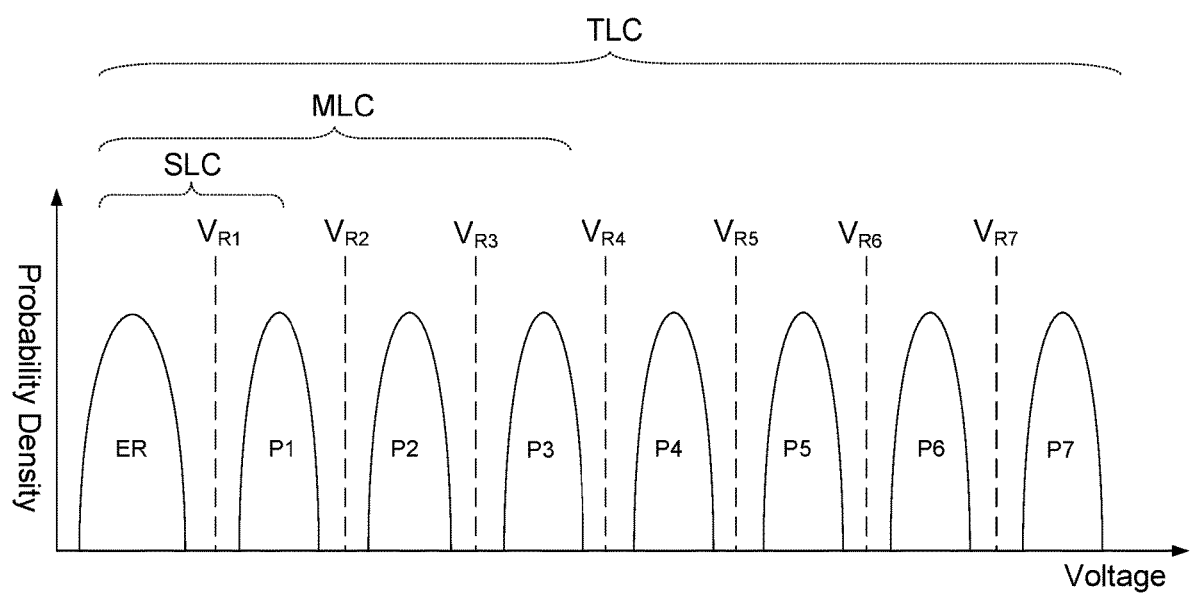
FIG. 6 illustrates a threshold voltage $V_{th}$ distribution of a NAND flash memory, according to some embodiments.

FIG. 6 illustrates a threshold voltage $V_{th}$ distribution of a NAND flash memory programmed in the triple-level cell (TLC) mode, according to some embodiments. In some embodiments, each state of the memory cells can correspond to a specific range of threshold voltage $V_{th}$, where the threshold voltage $V_{th}$ distribution of each state can be represented by a probability density. In some embodiments, the eight TLC states can be programmed by using an incremental step pulse programming (ISPP) scheme where the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage.

In some embodiments, after programming, the eight TLC states ER and P1-P7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage $V_{th}$ can be determined. For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, via the page buffer/sense amplifier 50, the threshold voltage $V_{th}$ or the state of the target memory cell can be verified.

In some embodiments, as described above, to determine the two states ER and P1 stored in the SLC mode, it is sufficient to rely on just the read reference voltage $V_{R1}$. To determine the four states ER and P1-P3 in the MLC mode, the read reference voltages $V_{R1}$, $V_{R2}$ and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly.

Embodiments described herein can use the above-noted non-limiting processes to write data to a NAND flash memory device as well as read stored data. In some embodiments, it is envisaged that read performance of NAND devices can be enhanced (e.g., speed increase) by using peripheral circuits described herein.

Figure 7:
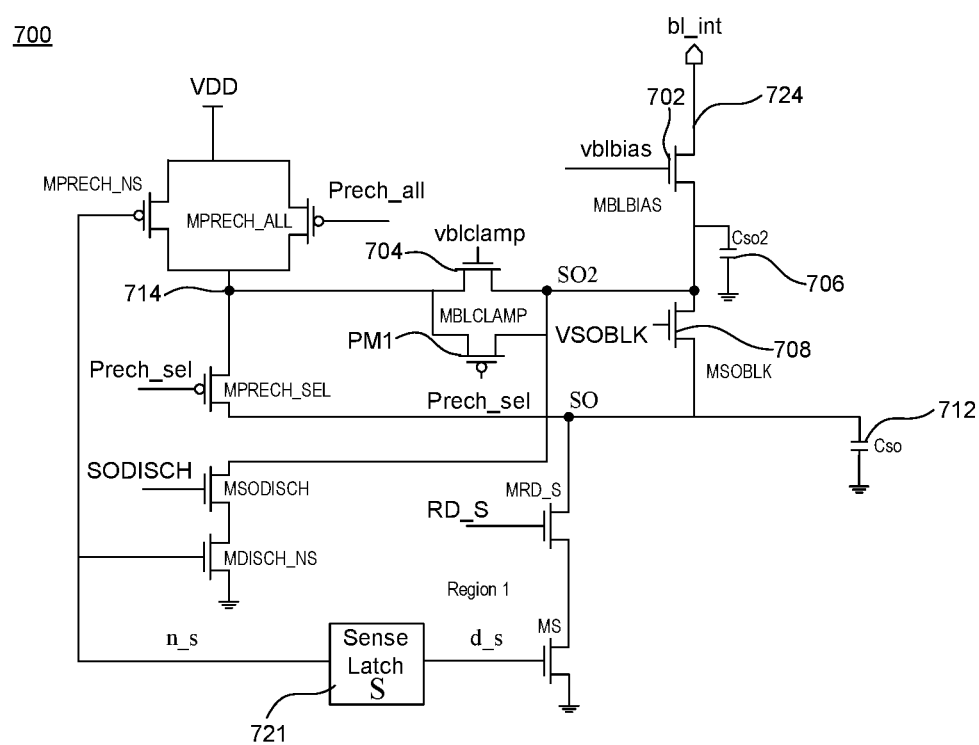
FIGS. 7 and 8 illustrates peripheral circuits, according to some embodiments.

FIG. 7 illustrates a peripheral circuit 700, according to some embodiments. In some embodiments, peripheral circuit 700 can represent a more detailed view of elements of FIGS. 3B and 4, for example, peripheral circuit 301 and page buffer/sense amplifier 50. Peripheral circuit 700 can be used to sense stored data in a memory cells. Peripheral circuit 700 can be coupled to a bit line 341 (FIGS. 4 and 5) of a memory cells via the connection labeled bl_int. Peripheral circuit 700 can include transistors 702, 704, and PM1 (e.g., first, second, and third transistors), a capacitance structure 706, and a sense latch S (e.g., a latch circuit).

It should be appreciated that, in some embodiments, enumerative adjectives (e.g., "first," "second," "third," or the like) can be used as a naming convention and are not intended to indicate an order or hierarchy (unless otherwise noted). For example, the terms "a first transistor" and "a second transistor" can distinguish two transistors, but need not specify if the transistors have a particular order or hierarchy. Furthermore, an element in a drawing is not limited to any particular enumerative adjective. For example, transistor 702 can be referred to as a first or second transistor provided that other transistors use non-conflicting enumerative adjectives.

In some embodiments, a first one of the terminals of transistors 702, 704, and PM1 can be coupled at node SO2. Another terminal (e.g., a second terminal) of transistor 704 can be coupled to another terminal (e.g., a second terminal) of transistor PM1 and also coupled to a node 714. Capacitance structure 706 can be coupled to the first terminal of transistor 702. Those skilled in the art will appreciate that the illustrated connection of capacitance structure 706 can have an electrical equivalence even when described in reference to transistor 704, transistor PM1, node SO2, transistor with gate terminal VSOBLK, or the like. For example, capacitance structure 706 being connected to the first terminal of transistor 702 is the same as being connected to node SO2. Latch circuit S 721 can be coupled to bit line 724 via transistor 702. Transistor 702 can be the portion of peripheral circuit 700 that connects to a bit line 724. The connection of latch circuit S 721 via transistor 702 can also include additional transistors along the connection path. The couplings of other elements of peripheral circuit 700 can be described in a similar manner based on the layout shown in FIG. 7. A terminal of transistor 708 can be coupled to a terminal of transistor PM1 while another terminal of transistor 708 can be coupled to capacitance structure 712. In other words, transistor 708 can be coupled in between transistor PM1 and capacitance structure 712. Furthermore, FIG. 7 illustrates capacitance structure 706 as a capacitor. However, parasitic capacitance can also be used (see description below in reference to FIG. 12). It should be appreciated that a transistor can also include a gate terminal.

In some embodiments, peripheral circuit 700 can sense a signal from bit line 724 when a read operation is performed on a memory cell associated with bit line 724. The sensed signal has properties associated with the stored data in the memory cell (e.g., current flows when a given $V_{th}$ is overcome). Based on the read or verify operation, the sensed signal can be used to cause sense latch S 721 to exhibit an electronic state that corresponds to the stored data. In this manner, read operations can read the content stored in the memory cells of the memory device.

In some embodiments, peripheral circuit 700 can also include a node SO and transistor 708 and other circuit elements, such as precharge circuit elements. In the absence of transistor PM1 and capacitance structure 706, the circuit elements connected at node SO can discharge when the voltage VSOBLK opens transistor 708. Transistors 704, 708, and PM1 and capacitance structures 706 can be part of a discharge circuit. Peripheral circuit 700 can undergo a plurality of read operations in a short span of time and it is important to discharge relevant circuit elements from one read operation to the next. By increasing the discharge speed, read accuracy and read speed can be significantly enhanced. The inclusion of transistor PM1 and capacitance structure 706 in peripheral circuit 700 has an effect on how currents and/or voltages behave at transistor 708. For example, VSOBLK at transistor 708 will open earlier with a larger cell current when transistor PM1 and capacitance structure 706 are implemented as shown in FIG. 7. The result is that elements connected to node SO can discharge earlier, shortening the time per read operation. By comparison, a traditional scheme that does not have transistor PM1 and capacitance structure 706 would result in slower opening of VSOBLK and slower performance.

Figure 9:
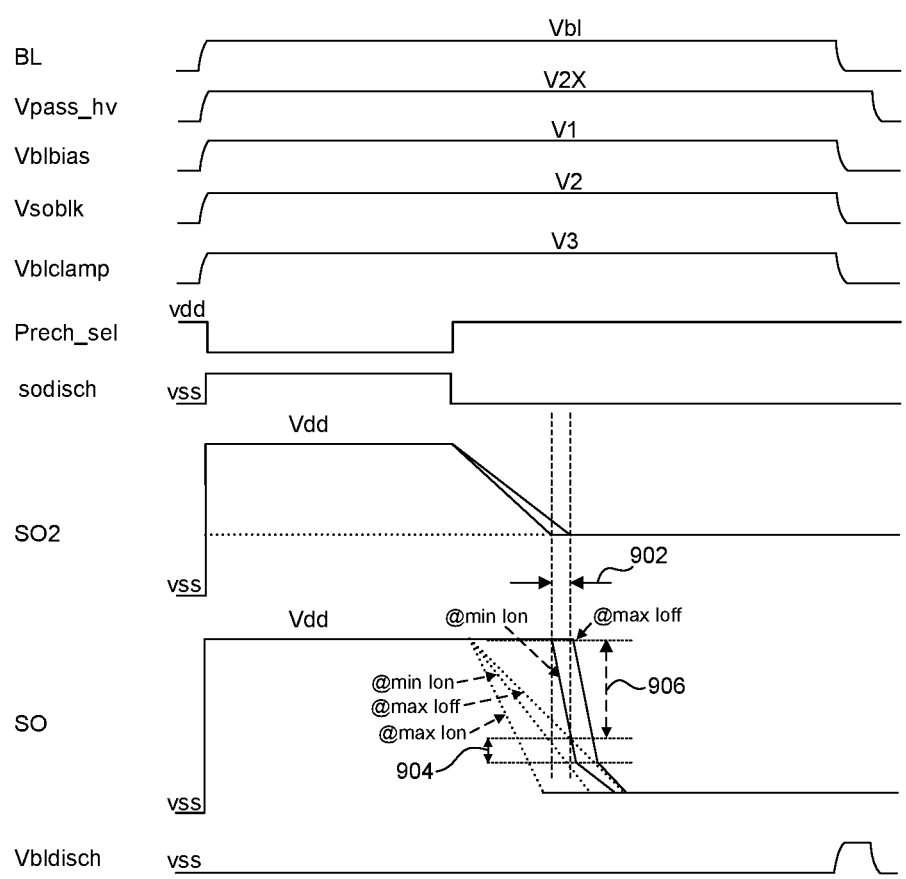
FIG. 9 illustrates graphs of voltages at various structures of peripheral circuits, according to some embodiments.

As will be discussed in reference to FIG. 9, in some embodiments, circuit arrangements disclosed herein (e.g., peripheral circuit 700) can enhance a read margin 906 (FIG. 9) at the node SO at the end of a develop time interval 902 (FIG. 9). Thus, read accuracy can be enhanced. From another perspective, the SO voltage difference can be reduced to the previous unenhanced levels by using a smaller current difference. This allows reduction of bit line precharge time, shortening the time it takes to complete read and verify operations. Transistor elements in FIG. 7 involved in precharge operations can include, for example, elements with labels MPRECH_NS, MPRECH_ALL, Prech_all, Prech_sel, and MPRECH_SEL.

In some embodiments, the inclusion of capacitance structure 706 allows control of amplification of a voltage difference between on and off states at node SO. Peripheral circuit can include a capacitance structure 712 with a capacitance value Cso (coupled to node SO, which is electrically distinct from being coupled to node SO2). The capacitance value Cso2 corresponds to capacitance structure 706. Cso can be chosen to be smaller than Cso2 in order to amplify the difference between on and off voltages at the node SO. For disambiguation, some embodiments can enumerate nodes, for example, node SO2 can be a first node, node SO can be a second node, and node 714 can be a third node. Those skilled in the art will appreciate that capacitance structures described herein (e.g., 706, 712, or the like) can comprise an arrangement of plural capacitance structures (e.g., capacitors in series, capacitors in parallel, or combinations of capacitors in series and in parallel).

Figure 8:
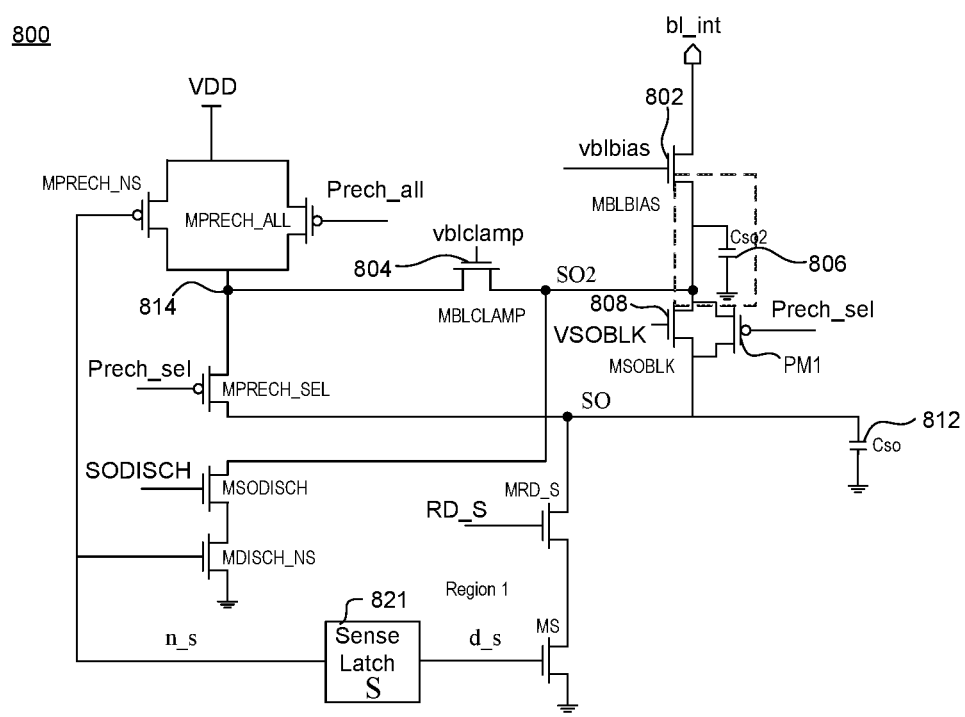

FIG. 8 illustrates a peripheral circuit 800, according to some embodiments. In some embodiments, peripheral circuit 800 can include structures and functions similar to peripheral circuit 700 that were described in reference to FIG. 7. Therefore, unless otherwise noted, descriptions of elements of FIG. 7 may also apply to corresponding elements of FIG. 7 (e.g., reference numbers sharing the two right-most numeric digits). For example, transistors 802, 804, and 808, capacitance structures 806 and 812, node 814, and sense latch S 821 can have structures and functions corresponding to transistors 702, 704, and 708, capacitance structures 706 and 712, node 714 (FIG. 7), and sense latch S 721. A difference between peripheral circuits 700 and 800 is that the location of transistor PM1 has changed.

In some embodiments, a first one of the terminals of transistors 802, 808, and PM1 can be coupled at node SO2. Another terminal (e.g., a second terminal) of transistor 808 can be coupled to another terminal (e.g., a second terminal) of transistor PM1. This type of connection achieves results similar to those described above in reference to FIG. 7—i.e., offset a timing of a read operation performed using peripheral circuit 800 (e.g., VSOBLK opening earlier when compared to a peripheral circuit that does not implement transistor PM1).

FIG. 9 illustrates graphs of voltages at various structures of peripheral circuits 700 and/or 800, according to some embodiments. In some embodiments, each timeline represents a voltage magnitude at a correspondingly labeled structure of peripheral circuits 700 and/or 800 (e.g., Vblbias, Vsoblk, Vblclamp, Prech_sel, sodisch, node SO, node SO2, and Vbldisch). The voltage levels Vdd and Vss correspond to power supply voltage levels as understood by persons of skill in the art. Though the labels BL and Vpass_hv do not appear in FIGS. 7 and 8, those skilled in the art will appreciate that voltages corresponding to the bit line BL (bl_int 724 (FIGS. 7 and 8)) and Vpass_hv are applied to corresponding structures of a memory die 100 (FIGS. 1, 3A, 3B, and 4) as described above (e.g., $V_{pass}$ applied to an unselected word line).

In some embodiments, a voltage change labeled @min_Ion (at node SO) corresponds to a voltage change associated with an on-current (I_on or Ion) at node SO. The voltage at node SO determines when transistors 708/808 (FIGS. 7 and 8) can open or turn on to begin discharging. Since a read operation relies on a magnitude of the on-current, the on-current can also be attributed a minimum or maximum threshold (e.g., @min_Ion can be a minimum threshold at which a read operation can reliably extract data from a memory cell). In an off state, a current may also be present at node SO. The current that corresponds to the off state can be referred to as the off-current (I_off or Ioff). Similarly, the off-current and its minimum and maximum thresholds for a read operation can be referred to as "@min_Ioff" and "@max_Ioff." FIG. 9 shows @min_Ion and @max_Ioff for two different scenarios (denoted by solid lines or dotted lines). Solid lines refer to a scenario that uses transistor PM1 and capacitance structures 706 or 806 in reference to FIGS. 7 and 8. Dotted lines illustrate a traditional scenario that omits transistor PM1 and capacitance structures 706 or 806 from FIGS. 7 and 8.

In some embodiments, a read operation relies on a voltage gap between @min_Ion and @max_Ioff at a given instance in time (a time instance is shown as a vertical dashed line). In the dotted line scenario (no transistor PM1 or capacitance structure 706/806), a read operation can read from a memory cell during a develop period 902. The reading is reliable when the voltage difference between @min_Ion and @max_Ioff is larger than a given magnitude. It is noted that the voltage at node SO2 can be relevant to the voltage level at SO, in particular during develop period 902. Though the voltage at node SO2 can vary during develop period 902, the variation is much less than the amplification effect observed at node SO (enhance sense amplify; read margin 906). This can allow earlier discharge of transistors 708/808 (FIGS. 7 and 8). In the dotted line scenario (traditional peripheral circuit without transistor PM1 or capacitance structure 706/806 (FIGS. 7 and 8)), the greatest voltage difference between @min_Ion and @max_Ioff is shown as read margin 904, which occurs toward the end of develop period 902. In contrast, the solid line scenario (using transistor PM1 or capacitance structure 706/806), the greatest voltage difference between @min_Ion and @max_Ioff (read margin 906) is significantly amplified (enhanced sense amplifier). As a result, the read operation can perform the sensing of the stored data in the memory cell before the end of develop period 902. The timing mechanism is explained in more detail in reference to FIG. 10.

In some embodiments, the use of transistor PM1 and capacitance structures 712/812 (FIGS. 7 and 8) enhance a voltage difference between @min_Ion and @max_Ioff at the end of develop period 902 (i.e., read margin 906). The enhancement can be, for example, from approximately 0.2 V to approximately 0.61 V—approximately a 3-fold increase compared to not using transistor PM1 and capacitance structures 712/812 (the dotted line scenario). The enhancement of read margin 906 can also be referred to as an enhanced sense amplifier. The enhance sense amplification (voltage at node SO) allows earlier discharge of transistors 708/808 (FIGS. 7 and 8), resulting in reduction of bit line precharge time and shortening of time to complete read and verify operations. The voltage increase (read margin 906) can correspond to the condition that the ratio Cso2:Cso is approximately 3:1 (non-limiting example). Other ratios may be used to increase the enhancement of the voltage difference between @min_Ion and @max_Ioff. Therefore, using transistor PM1 and/or capacitance structure 706/806 as shown in FIGS. 7 and 8 can enhance the sense amplification when executing a read operation so as to increase the accuracy of the read operation. In some embodiments, the value of Cso2 can be at least two times, three times, four times, or five times greater than the value of Cso.

Figure 10:
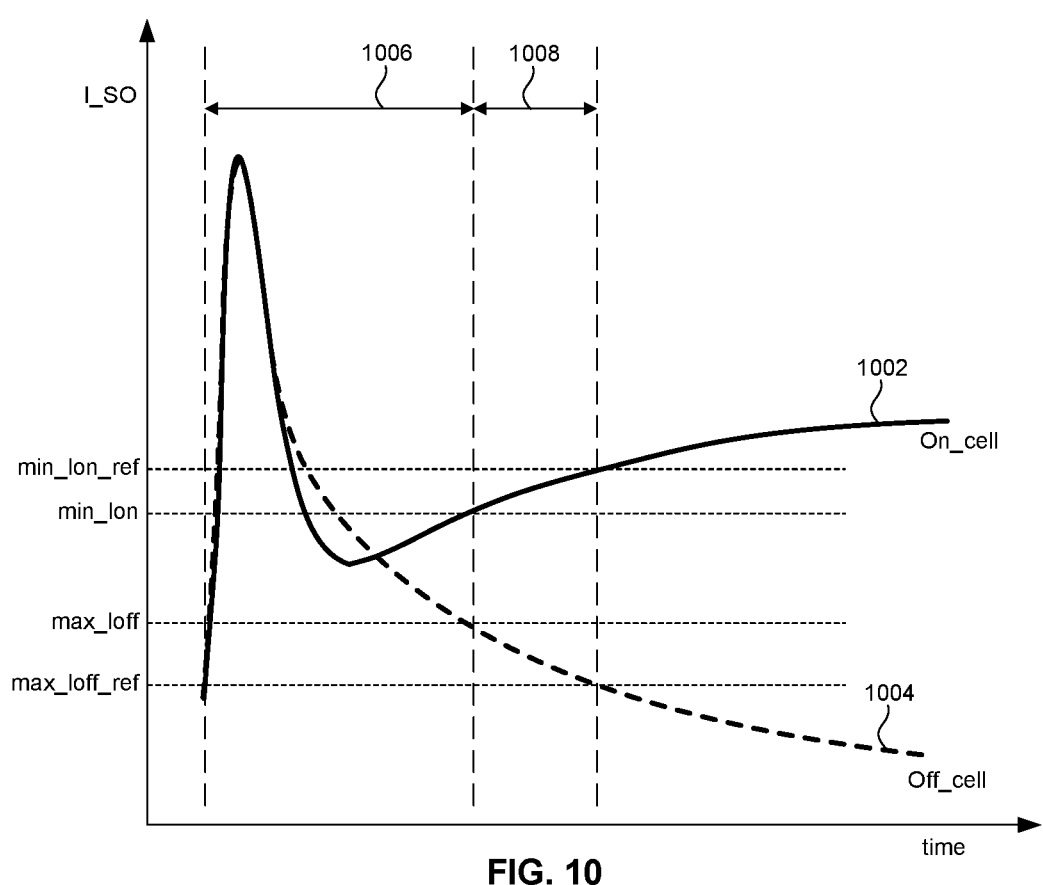
FIG. 10 illustrates a timeline of currents at a node of a peripheral circuit, according to some embodiments.

FIG. 10 illustrates a timeline of currents at node SO (FIGS. 7 and 8), according to some embodiments. In some embodiments, plot 1002 is associated with an on state of a memory cell (I_on). Plot 1004 is associated with an off state of a memory cell (I_off). Based on the use of transistor PM1 and capacitance structure 706/806 in peripheral circuit 700/800 (FIGS. 7 and 8), a develop time can be shortened down as shown by develop time 1006. The length of develop time 1006 corresponds to the time at which min_Ion and max_Ioff reach corresponding voltage levels for reliable data sensing from the memory cell. As a reference, when omitting the use of transistor PM1 and capacitance structure 706/806 in peripheral circuit 700/800 (FIGS. 7 and 8), the time it takes to reach corresponding voltage levels for reliable data sensing from the memory is the time it takes for the currents to reach min_Ion_ref and max_Ioff_ref. A time difference 1008 is the amount of time that a read operation can be shortened when using transistor PM1 and capacitance structure 706/806 in peripheral circuit 700/800 (FIGS. 7 and 8). A pre-charge time of the bit line can be reduced.

In some embodiments, FIGS. 7 and 8 illustrated examples of simple peripheral circuits that use one latch circuit. In some embodiments, peripheral circuits can include additional latches to fulfill different purposes (e.g., additional latches for memory array architectures that have upper and lower pages, plural-level cells, caching, or the like).

Figure 11A:
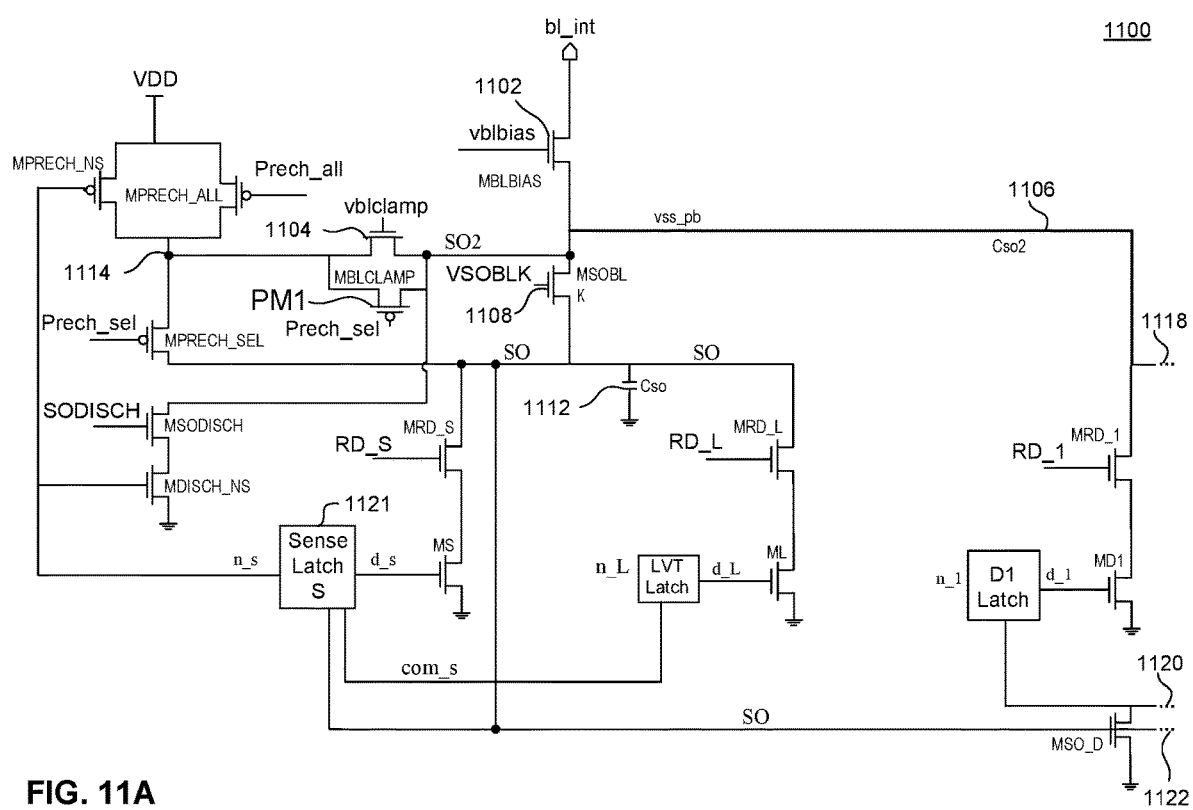
FIGS. 11A and 11B illustrate a peripheral circuit, according to some embodiments.
Figure 11B:
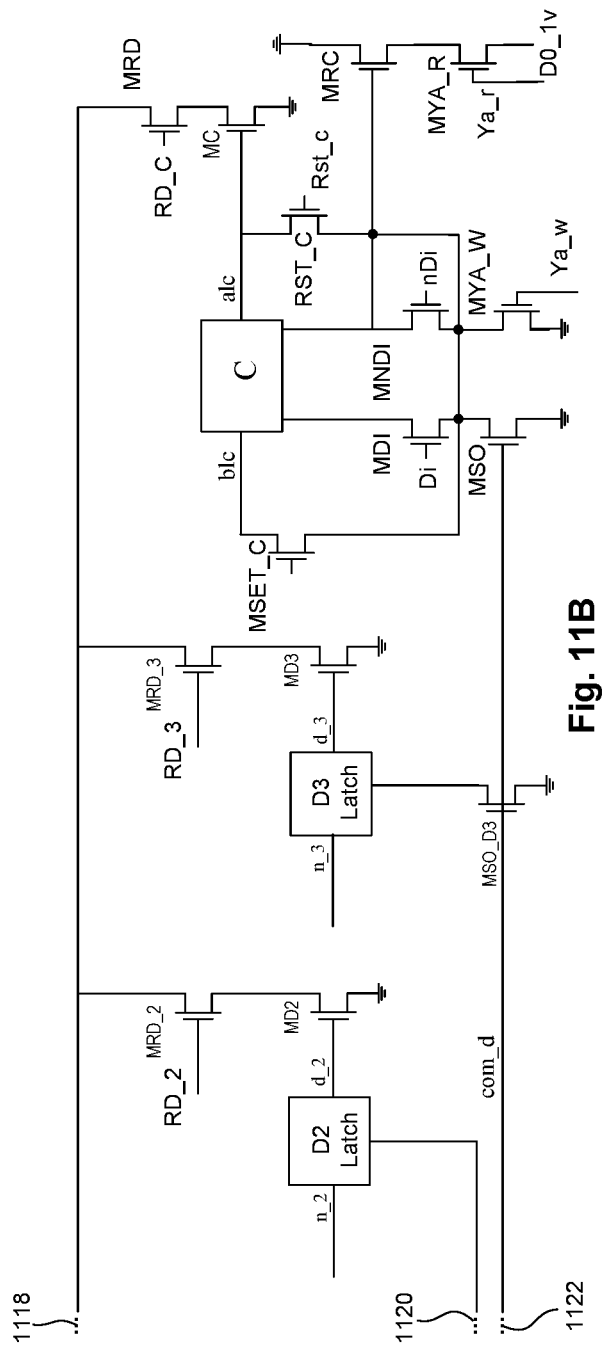

FIGS. 11A and 11B illustrate a peripheral circuit 1100, according to some embodiments. FIG. 11B is a continuation of FIG. 11A. In some embodiments, peripheral circuit 1100 can include structures and functions similar to peripheral circuits 700 and 800 that were described in reference to FIGS. 7 and 8. Therefore, unless otherwise noted, descriptions of elements of FIGS. 11A and 11B may also apply to corresponding elements of FIGS. 7 and 8 (e.g., reference numbers sharing the two right-most numeric digits). For example, transistors 1102, 1104, and 1108, capacitance structure 1112, node 1114, and sense latch S 1121 can have structures and functions corresponding to transistors 702, 704, and 708, capacitance structures 712, node 714 (FIG. 7), and sense latch S 721. FIGS. 11A and 11B are illustrated across two pages. The portions of peripheral circuit 1100 across the two pages are connected to one another via connections 1118, 1120, and 1122.

In some embodiments, the disposition and connections of transistor PM1 shown in FIG. 11A corresponds to the disposition and connections as described in reference to FIG. 7. However, it is to be appreciated that PM1 in FIG. 11A can also be disposed and connected as described in reference to FIG. 8 (e.g., connected in parallel to transistor 1108). Capacitance structure 1106 can include a length of wire having a parasitic capacitance. Capacitance structure 1112 can include a capacitor or a length of wire having a parasitic capacitance (also applicable to capacitance structures 712 and 812 (FIGS. 7 and 8)). The effects of transistor PM1 and capacitance structure 1106 are as described above in reference to FIGS. 7-10.

In some embodiments, peripheral circuit 1100 can also include additional latch circuits (e.g., latch circuits LVT, D1, D3, D4, and C) with associated circuitry (e.g., associated transistors). The length of wire of capacitance structure 1106 can be coupled to a transistor 1116 that is associated with latch circuit D1. The parasitic capacitance provided by capacitance structure 1106 can fulfill the functions as described above with respect to FIGS. 7-10. In a non-limiting example, capacitance values of capacitance structures 1106 and 1112 can have a ratio of 12:10 (or a 1.2 ratio, or greater), which can increase the enhancement of the voltage difference between @min_Ion and @max_Ioff by at least two times. Other capacitance values are also envisaged, as well as other enhancement values of the voltage difference between @min_Ion and @max_Ioff.

While FIGS. 11A and 11B show three latches D1, D2, and D3, it is envisaged that, in some embodiments, peripheral circuit 1100 can comprise N latches (e.g., D1-DN) along with associated circuitry.

Figure 12:
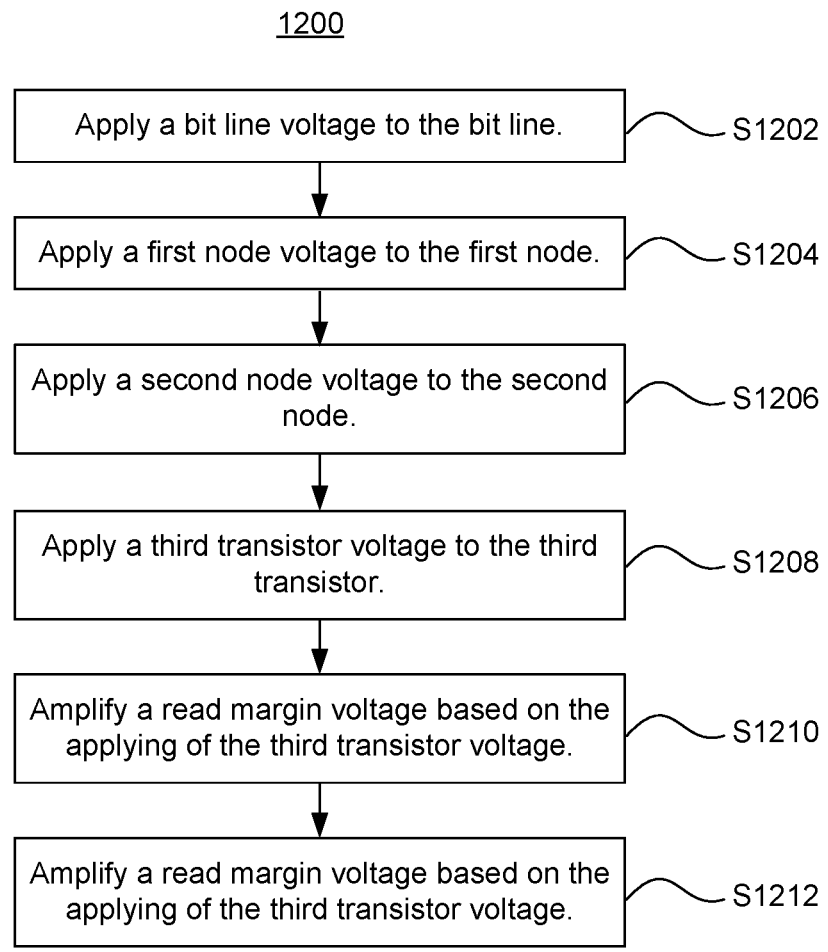
FIG. 12 illustrates a method for operating a memory device, according to some embodiments.

FIG. 12 shows a method 1200 for operating a memory device, according to some embodiments. The memory device can be implemented according to aspects described herein in reference to FIGS. 1-11B (e.g., comprising a memory array, page buffer 700, plurality of memory cells, latch circuit, transistors 704, 708, and PM1, capacitance structures, and the like, and function as described in reference to FIGS. 1-11B). In some embodiments, method 1200 can represent steps for performing a read or verify operation of stored data in the memory cells.

In some embodiments, at step S1202, a bit line voltage can be applied to a bit line bl_int. Memory cells of the memory device can be coupled to the bit line. At step S1204, a first node voltage can be applied to a first node (e.g., node SO2). First terminals of first, second, and third transistors (e.g., 704, 708, PM1) can be coupled to the bit line. At step S1206, a second node voltage can be applied to a second node (e.g., node SO). A second terminal of the second transistor can be coupled to the second node.

In some aspects, at step S1208, a third transistor voltage can be applied to the third transistor (e.g., PM1). At step S1210, a read margin voltage (e.g., 906) can be amplified based on the applying of the third transistor voltage. As explained earlier in reference to FIG. 9, the first node voltage and the second node voltage can decrease during a develop time period 902 after the applying of the third transistor voltage. The read margin voltage 906 is defined at an end of the develop time period 902. The read margin voltage 906 corresponds to a voltage difference between a value of the second node voltage (SO) associated with a maximum threshold for current corresponding to an off-state of the second node (max_Ioff) at the end of the develop time period 902 and a value of the second node voltage associated with a minimum threshold for current corresponding to an on-state of the second node (min_Ion) at the end of the develop time period 902. At step S1212, the stored data in the memory cells is sensed using the latch circuit before the end of the develop time period 902.

In some embodiments, the structures and methods described herein are not limited to read operations. For example, programming time can also be reduced (e.g., reducing the verify time after programming). Other method steps are envisaged based on the functions described herein in reference to FIGS. 1-11B.

The method steps in embodiments disclosed herein can be performed in any conceivable order and it is not required that all steps be performed.

In summary, the present disclosure provides a page buffer that can provide operation time reduction for a memory device. The memory device can include a memory array and the page buffer. The memory array can include a plurality of memory cells coupled to a bit line of the memory array. The memory cells can store data. The page buffer can be coupled to the plurality of memory cells via the bit line and can sense the stored data. The page buffer can include first, second, and third transistors coupled to the bit line, first and second nodes, a capacitance structure coupled to the first node, and a latch circuit coupled to the bit line via the first transistor. First terminals of the first, second, and third transistors can be coupled to the first node. A second terminal of the second transistor can be coupled to the second node. The third transistor can amplify a read margin voltage at the second node. The page buffer can shorten a time of execution of a read operation or verify operation for sensing the stored data based on the amplification of the read margin voltage. The latch circuit can exhibit an electronic state corresponding to the stored data based on the read operation or verify operation.

Furthermore, the present disclosure provides a page buffer that can provide operation time reduction for a memory system. The memory system can include a memory device. The memory device can include a memory array and the page buffer. The memory array can include a plurality of memory cells coupled to a bit line of the memory array. The memory cells can store data. The page buffer can be coupled to the plurality of memory cells via the bit line and can sense the stored data. The page buffer can include first, second, and third transistors coupled to the bit line, first and second nodes, a capacitance structure coupled to the first node, and a latch circuit coupled to the bit line via the first transistor. First terminals of the first, second, and third transistors can be coupled to the first node. A second terminal of the second transistor can be coupled to the second node. The third transistor can amplify a read margin voltage at the second node. The page buffer can shorten a time of execution of a read operation or verify operation for sensing the stored data based on the amplification of the read margin voltage. The latch circuit can exhibit an electronic state corresponding to the stored data based on the read operation or verify operation.

Furthermore, the present disclosure provides a page buffer that can provide operation time reduction in the operation of a memory device. The memory device can include a memory array that includes the page buffer and a plurality of memory cells coupled to a bit line of the memory array. The page buffer can include a capacitance structure, a latch circuit, a first transistor, a second transistor, a third transistor, a first node, and a second node. First terminals of the first, second and third transistors can be coupled to the bit line. A second terminal of the second transistor can be coupled to the second node. The method can include performing a read or verify operation of stored data in the memory cells. The performing of the read or verify operation can include one or more of the following operations. The performing of the read or verify operation can include applying a bit line voltage to the bit line. The performing of the read or verify operation can also include applying a first node voltage to the first node. The performing of the read or verify operation can also include applying a second node voltage to the second node. The performing of the read or verify operation can also include applying a third transistor voltage to the third transistor. The performing of the read or verify operation can also include amplifying a read margin voltage based on the applying of the third transistor voltage. The first node voltage and the second node voltage can decrease during a develop time period after the applying of the third transistor voltage. The read margin voltage can be defined at an end of the develop time period and can correspond to a voltage difference between a value of the second node voltage associated with a maximum threshold for current corresponding to an off-state of the second node at the end of the develop time period and a value of the second node voltage associated with a minimum threshold for current corresponding to an on-state of the second node at the end of the develop time period. The performing of the read or verify operation can also include sensing the stored data in the memory cells using the latch circuit before the end of the develop time period.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device comprising:
    a memory array comprising a plurality of memory cells coupled to a bit line of the memory array, wherein the memory cells are configured to store data; and
    a page buffer coupled to the plurality of memory cells via the bit line and configured to sense the stored data, the page buffer comprising:
        first, second, and third transistors coupled to the bit line;
        first and second nodes,
            wherein first terminals of the first, second, and third transistors are coupled to the first node,
            wherein a second terminal of the second transistor is coupled to the second node, and
            wherein the third transistor is configured to amplify a read margin voltage at the second node, and
            wherein the page buffer is configured to shorten a time of execution of a read operation or verify operation for sensing the stored data based on the amplification of the read margin voltage;
        a capacitance structure coupled to the first node; and
        a latch circuit coupled to the bit line via the first transistor and configured to exhibit an electronic state corresponding to the stored data based on the read operation or verify operation.

2. The memory device of claim 1, wherein the capacitance structure comprises a capacitor or a length of circuit wire having a parasitic capacitance.

3. The memory device of claim 1, wherein:
    the capacitance structure is a first a capacitance structure; and
    the page buffer further comprises a second capacitance structure coupled to the second node.

4. The memory device of claim 3, wherein the second capacitance structure comprises a capacitor or a length of circuit wire having a parasitic capacitance.

5. The memory device of claim 3, wherein a capacitance of the second capacitance structure is less than a capacitance of the first capacitance structure.

6. The memory device of claim 3, wherein a capacitance of the first capacitance structure is at least two times greater than a capacitance of the second capacitance structure.

7. The memory device of claim 1, wherein a second terminal of the third transistor is coupled to the first node.

8. The memory device of claim 1, wherein a second terminal of the third transistor is coupled to the second node.

9. The memory device of claim 1, wherein the capacitance structure is configured to reduce a duration of the read operation or verify operation, whereby a performance of the memory device is enhanced based on the reducing of the duration.

10. The memory device of claim 1, wherein:
the latch circuit is a first latch circuit;
the page buffer further comprises a second latch circuit and a transistor associated with the second latch circuit;
the capacitance structure comprises a length of wire having a parasitic capacitance; and
the length of wire is coupled to the transistor associated with the second latch circuit.

11. A memory system comprising:
a memory device comprising:
  a memory array comprising a plurality of memory cells coupled to a bit line of the memory array, wherein the memory cells are configured to store data; and
  a page buffer coupled to the plurality of memory cells via the bit line and configured to sense the stored data, the page buffer comprising:
    first, second, and third transistors coupled to the bit line;
    first and second nodes,
      wherein first terminals of the first, second, and third transistors are coupled to the first node of the page buffer,
      wherein a second terminal of the second transistor is coupled to the second node, and
      wherein the third transistor is configured to amplify a read margin voltage at the second node, and
      wherein the page buffer is configured to shorten a time of execution of a read operation or verify operation for sensing the stored data based on the amplification of the read margin voltage;
    a capacitance structure coupled to the first node; and
    a latch circuit coupled to the bit line via the first transistor and configured to exhibit an electronic state corresponding to the stored data based on the read operation or verify operation.

12. The memory system of claim 11, wherein the capacitance structure comprises a capacitor or a length of circuit wire having a parasitic capacitance.

13. The memory system of claim 11, wherein:
the capacitance structure is a first capacitance structure; and
the page buffer further comprises a second capacitance structure coupled to the second node.

14. The memory system of claim 13, wherein the second capacitance structure comprises a capacitor or a length of circuit wire having a parasitic capacitance.

15. The memory system of claim 14, wherein a capacitance of the second capacitance structure is less than a capacitance of the first capacitance structure.

16. The memory system of claim 14, wherein a capacitance of the first capacitance structure is at least two times greater than a capacitance of the second capacitance structure.

17. The memory system of claim 11, wherein a second terminal of the third transistor is coupled to the first node.

18. The memory system of claim 11, wherein a second terminal of the third transistor is coupled to the second node.

19. The memory system of claim 11, wherein the capacitance structure is configured to reduce a duration of the read operation or verify operation, whereby a performance of the memory device is enhanced based on the reducing of the duration.

20. The memory system of claim 11, wherein:
the latch circuit is a first latch circuit;
the page buffer further comprises a second latch circuit and a transistor associated with the second latch circuit;
the capacitance structure comprises a length of wire having a parasitic capacitance; and
the length of wire is coupled to the transistor associated with the second latch circuit.

* * * * *